(12) United States Patent
Ahn et al.

(10) Patent No.: US 10,679,764 B2
(45) Date of Patent: Jun. 9, 2020

(54) METAL NANOWIRE ELECTRODE AND MANUFACTURING METHOD OF THE SAME

(71) Applicants: Samsung Display Co., Ltd., Yongin-si, Gyeonggi-do (KR); KOREA ADVANCED INSTITUTE OF SCIENCE AND TECHNOLOGY, Daejeon (KR)

(72) Inventors: Jae Ho Ahn, Daejeon (KR); Sang Youn Han, Seoul (KR); Jung Yong Lee, Daejeon (KR)

(73) Assignees: SAMSUNG DISPLAY CO., LTD., Gyeonggi-Do (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 23 days.

(21) Appl. No.: 15/863,165

(22) Filed: Jan. 5, 2018

(65) Prior Publication Data
US 2018/0358144 A1 Dec. 13, 2018

(30) Foreign Application Priority Data

Jun. 12, 2017 (KR) .......................... 10-2017-0073254

(51) Int. Cl.
*H01B 1/02* (2006.01)
*B32B 43/00* (2006.01)
(Continued)

(52) U.S. Cl.
CPC .............. *H01B 1/02* (2013.01); *B32B 37/025* (2013.01); *B32B 38/10* (2013.01); *B32B 43/006* (2013.01);
(Continued)

(58) Field of Classification Search
CPC .......... B32B 38/10; B32B 43/00; C25D 17/10; H01B 1/02
(Continued)

(56) References Cited

U.S. PATENT DOCUMENTS

| 8,642,118 B2 | 2/2014 | Goto et al. |
| 2009/0129004 A1 | 5/2009 | Gruner |
| 2014/0332254 A1 | 11/2014 | Pellerite et al. |

FOREIGN PATENT DOCUMENTS

| KR | 101193315 B1 | 10/2012 |
| KR | 101249593 B1 | 3/2013 |

(Continued)

OTHER PUBLICATIONS

Jaeho Ahn, et al., "Extremely Robust and Patternable Electrodes for Copy-Paper-Based Electronics", ACS Appl. Mater. Interfaces 2016, 8, 19031-19037.

*Primary Examiner* — Khanh T Nguyen
(74) *Attorney, Agent, or Firm* — Cantor Colburn LLP (57) ABSTRACT

A method of manufacturing a metal nanowire electrode, the method including: forming a plurality of metal nanowires on a preliminary substrate; forming a metal nanowire layer by chemically reducing the plurality of metal nanowires; separating the metal nanowire layer from the preliminary substrate; transferring the separated metal nanowire layer to a surface of a carrier substrate, wherein the surface of the carrier substrate comprises a hydrophobic treatment; forming an adhesive pattern on a target substrate; and forming the metal nanowire electrode by transferring the separated metal nanowire layer to the target substrate.

12 Claims, 10 Drawing Sheets

(51) Int. Cl.
*B32B 38/10*       (2006.01)
*B32B 37/00*       (2006.01)
*H01L 51/00*       (2006.01)
*H01L 31/0224*     (2006.01)
*H01L 51/52*       (2006.01)
*H01B 3/44*        (2006.01)
*H01B 3/42*        (2006.01)
*G02F 1/1343*      (2006.01)
*G06F 3/041*       (2006.01)
*H01B 3/30*        (2006.01)

(52) U.S. Cl.
CPC ........ *H01L 51/003* (2013.01); *H01L 51/0023* (2013.01); *G02F 1/13439* (2013.01); *G02F 2202/36* (2013.01); *G06F 3/041* (2013.01); *G06F 2203/04103* (2013.01); *H01B 3/306* (2013.01); *H01B 3/422* (2013.01); *H01B 3/44* (2013.01); *H01B 3/445* (2013.01); *H01L 31/022425* (2013.01); *H01L 51/5203* (2013.01)

(58) Field of Classification Search
USPC .......................................... 252/514; 427/120
See application file for complete search history.

(56) References Cited

FOREIGN PATENT DOCUMENTS

| KR | 101334601 B1 | 11/2013 | |
|----|---|---|---|
| KR | 101437639 B1 | 8/2014 | |
| KR | 101442727 B1 | 9/2014 | |
| KR | 2016-0124468 A * | 10/2016 | ............... H01B 1/02 |
| KR | 1020170028687 A | 3/2017 | |
| KR | 1020170067204 A | 6/2017 | |

* cited by examiner

METAL NANOWIRE ELECTRODE AND MANUFACTURING METHOD OF THE SAME

This application claims priority to and the benefit of Korean Patent Application No. 10-2017-0073254 filed on Jun. 12, 2017, and all the benefits accruing therefrom under 35 U.S.C. § 119, the content of which in its entirety is herein incorporated by reference.

BACKGROUND

(a) Technical Field

The present disclosure relates to a metal nanowire electrode and a method of manufacturing the same.

(b) Description of the Related Art

A flat liquid crystal display, a touch panel, an electroluminescent device, a thin film photovoltaic cell, and the like, include a transparent electrode and a non-transparent electrode.

In general, a metal oxide such as an indium doped tin oxide (ITO) is used as a transparent electrode, and a thin film made of silver, copper, gold, or a mixture thereof is used as a non-transparent electrode.

The transparent electrode and the non-transparent electrode are resistant to bending, folding, and stretching. Accordingly, it is difficult to apply the transparent electrode and the non-transparent electrode to a bendable device, a foldable device, or a stretchable device. Thus there is a need for a transparent electrode or a non-transparent electrode that are capable of being used in a bendable device, a foldable device, or a stretchable device.

The above information disclosed in this Background section is only for enhancement of understanding of the background of the invention and therefore it may contain information that does not form the prior art that is already known in this country to a person of ordinary skill in the art.

SUMMARY

The present invention has been made in an effort to provide a metal nanowire electrode and a method of manufacturing the same.

A method of manufacturing a metal nanowire electrode according to an exemplary embodiment includes: forming a plurality of metal nanowires on a preliminary substrate; forming a metal nanowire layer by chemically reducing the plurality of metal nanowires; separating the metal nanowire layer from the preliminary substrate; transferring the separated metal nanowire layer to a surface of a carrier substrate, wherein the surface of the carrier substrate comprises a hydrophobic treatment; forming an adhesive pattern on a target substrate; and forming the metal nanowire electrode by transferring the separated metal nanowire layer to the target substrate.

In the forming of the metal nanowire layer, the plurality of metal nanowires may be reduced and thus neighboring metal nanowires may be connected to each other.

A reducing agent used in the forming of the metal nanowire layer include an aldehyde, a tetrahydroborate, a polyhydroxybenzene, hydrazine, hydroxylamine, formaldehyde, a hypophosphite, a sulfite, lithium tetrahydroborate, sodium tetrahydroborate, potassium tetrahydroborate, $LiAlH_4$, hydroquinone, alkyl-substituted hydroquinones, pyrogallol, a phenylenediamine, an aminophenol, ascorbic acid, an ascorbic acid ketal, an ascorbic acid-containing material, 3-pyrazolidinone, hydroxytetronic acid, hydroxytetronamide, a bisnaphthol, a sulfonamidophenol, lithium, sodium, potassium, or a combination thereof.

The metal nanowire may include lead, indium, tin, aluminum, silver, copper, gold, platinum, titanium, iron, nickel, cobalt, or a combination thereof.

The metal nanowire may include silver, the reducing agent used in the forming of the metal nanowire may be hydrazine, and a reduction time may be about 1 minute (min) to about 10 min.

The metal nanowire may include copper, the reducing agent used in the forming of the metal nanowire may be hydrazine, and a reduction time may be about 20 seconds to about 60 seconds.

The separating of the metal nanowire layer from the preliminary substrate may be performed by immersing the metal nanowire layer in water.

In the transferring the separated metal nanowire layer to a surface of the carrier substrate, the carrier substrate may be immersed in water.

The carrier substrate may include polytetrafluoroethylene (PTFE), polydimethylsiloxane (PDMS), polyimide (PI), an acryl polymer, polyethylene terephthalate (PET), poly(methyl methacrylate) (PMMA), poly(urethane acrylate), or a combination thereof.

The forming of the metal nanowire electrode may further include: contacting the metal nanowire layer on the surface of the carrier substrate with the adhesive pattern on the target substrate; optionally compressing the carrier substrate to transfer the separated metal nanowire layer to the target substrate; and separating the carrier substrate from the target substrate.

The metal nanowire electrode may be formed on the adhesive pattern.

The adhesive pattern may include polydimethylsiloxane (PDMS), polyimide (PI), an acryl polymer, polyethylene terephthalate (PET), poly(methyl methacrylate) (PMMA), poly(urethane acrylate), polystyrene (PS), polydopamine, or a combination thereof.

A metal nanowire electrode according to an exemplary embodiment includes a plurality of metal nanowires, wherein adjacent metal nanowires among the plurality of metal nanowires are connected to each other.

The plurality of metal nanowires includes lead, indium, tin, aluminum, silver, copper, gold, platinum, titanium, iron, nickel, cobalt, or a combination thereof.

According to the exemplary embodiments, a metal nanowire electrode having improved stability with respect to bending, folding, or stretching can be provided.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

In addition, the size and thickness of each configuration shown in the drawings are arbitrarily shown for better understanding and ease of description, but the present invention is not limited thereto. In the drawings, the thickness of layers, films, panels, regions, etc., are exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, the word "over" or "on" means positioning on or below the object portion, but does not essentially mean positioning on the upper side of the object portion based on a gravity direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. In addition, unless explicitly described to the contrary, the word "comprise" and variations such as "comprises" or "comprising" will be understood to imply the inclusion of stated elements but not the exclusion of any other elements.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, the phrase "on a plane" means viewing a target object or portion thereof from the top of the object or portion thereof, and the phrase "on a cross-section" means viewing a cross-section of a target object or a portion thereof by vertically cutting the target object or portion thereof from the side.

Figure 1:
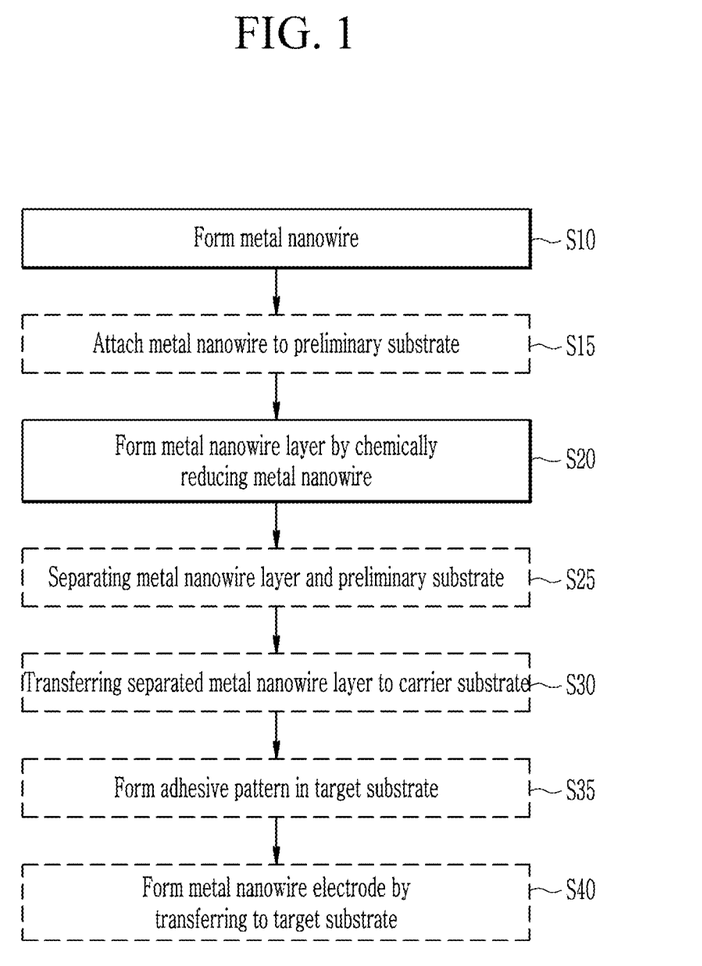
FIG. 1 is a flowchart of a method of manufacturing a metal nanowire electrode according to an exemplary embodiment.

FIG. 1 is a flowchart of a method of manufacturing a metal nanowire electrode according to an exemplary embodiment.

Referring to FIG. 1, a method for manufacturing a metal nanowire electrode according to the present exemplary embodiment includes: forming a metal nanowire (S10); attaching the metal nanowire to a preliminary substrate (S15); forming a metal nanowire layer by chemically reducing the metal nanowire (S20); separating the metal nanowire layer from the preliminary substrate (S25); transferring the separated metal nanowire layer to a carrier substrate (S30); forming an adhesive pattern in a target substrate (e.g., on a surface thereof) (S35); and forming a metal nanowire electrode by transferring the metal nanowire layer to the target substrate (S40). Accordingly, the metal nanowire electrode can be formed using the metal nanowire.

Next, the method of manufacturing the metal nanowire electrode according to the present exemplary embodiment will be described in detail.

The method of manufacturing the metal nanowire electrode according the present exemplary embodiment includes a step of first forming a metal nanowire (S10). In this case, the metal nanowire may have a diameter of about 1 nanometer (nm) to about 500 nm, or about 5 nm to about 300 nm, or from about 10 nm to about 250 nm, and a length of about 1 micrometer (μm) to about 500 μm, or about 5 μm to about 300 μm, or about 10 μm to about 250 μm.

Here, the metal nanowire may include a metal including lead (Pb), indium (In), tin (Sn), aluminum (Al), silver (Ag), copper (Cu), gold (Au), platinum (Pt), titanium (Ti), iron (Fe), nickel (Ni), cobalt (Co), or a combination thereof.

Further, the metal nanowire may be made of a mixture of at least one metal including lead (Pb), indium (In), tin (Sn), aluminum (Al), silver (Ag), copper (Cu), gold (Au), platinum (Pt), titanium (Ti), iron (Fe), nickel (Ni), or cobalt (Co), or a combination thereof, and a non-metal.

In addition, the metal nanowire according to the present exemplary embodiment may be prepared by etching a metal thin film in a shape of a metal network or a metal mesh, the metal thin film including a metal including lead (Pb), indium (In), tin (Sn), aluminum (Al), silver (Ag), copper (Cu), gold (Au), platinum (Pt), titanium (Ti), iron (Fe), nickel (Ni), cobalt (Co), or a combination thereof.

Subsequently, the metal nanowire is attached to the preliminary substrate (S15). Here, the metal nanowire may be attached to the preliminary substrate by deposition or coating methods. The deposition or coating methods are not limited and may be any method suitable for attaching the metal nanowire to the preliminary substrate.

Next, the metal nanowire is chemically reduced such that a metal nanowire layer is formed (S20). When the metal nanowire is chemically reduced, neighboring metal nanowires are connected to each other, and accordingly, the metal nanowire layer is formed. Such a metal nanowire layer can acquire high electrical conductivity due to the chemical reduction and the connection between adjacent metal nanowires, and as a result, sheet resistance of the metal nanowire layer can be decreased. In addition, the metal nanowire layer may have improved chemical stability without an optical loss.

In general, the manufacture of an electrode using a metal nanowire includes processes such as contacting individual metal nanowires through thermal treatment, compression, mixing with other materials, coating, and the like, and improving air stability.

When the metal nanowires are connected to each other through the thermal treatment, the substrate may be melted due to the high temperatures used for the thermal treatment. In addition, when the metal nanowires are connected to each other through the compression step, the substrate may be damaged due to the pressure. Further, when the metal nanowires are connected to each other by mixing with other materials, transmittance of the electrode may be decreased due to the use of a mixed material.

However, in the present exemplary embodiment, since the neighboring metal nanowires are connected to each other by chemically reducing the metal nanowires, the substrate can be prevented from being damaged and transmittance of the metal nanowire layer can be prevented from being decreased.

A reducing agent used in the chemical reduction of the metal nanowire may include hydrazine, hydroxylamine, an aldehyde such as formaldehyde, hypophosphites, sulfites, a tetrahydroborate such as lithium (Li) tetrahydroborate, sodium tetrahydroborate, and potassium (K) tetrahydroborate, $LiAlH_4$, polyhydroxybenzenes such as hydroquinone, $C_1$-$C_{10}$ alkyl-substituted hydroquinone, and pyrogallol, phenylenediamines, aminophenols, ascorbic acid, ascorbic acid ketals, an ascorbic acid-containing material, 3-pyrazolidinone, hydroxytetronic acid, hydroxytetronamide, bisnaphthols, sulfonamidophenols, lithium (Li), sodium (Na), potassium (K), or a combination thereof.

Here, the lithium tetrahydroborate is represented as $LiBH_4$, the sodium tetrahydroborate is represented as $NaBH_4$, and the potassium tetrahydroborate is represented as $KBH_4$.

The chemical reduction in the method of manufacturing the metal nanowire electrode according to the present exemplary embodiment, may be performed in various states, for example, a gaseous state or a solution state.

That is, in the method for manufacturing the metal nanowire electrode according to the present exemplary embodiment, the chemical reduction may be carried out by reacting the metal nanowire in a state in which the reducing agent is vaporized (e.g., in a gaseous state).

Alternatively, in the method of manufacturing the metal nanowire electrode according to the present exemplary embodiment, the reducing agent may be in a solution state and then the metal nanowire may be immersed in the solution containing the reducing agent so that the chemical reduction can be carried out.

In the present exemplary embodiment, the metal nanowires are manufactured and then they are connected with each through a reaction with the reducing agent. The reducing agent may be immersed into the metal nanowire solution for the reduction reaction before manufacturing the metal nanowire.

In the present exemplary embodiment, silver (Ag) may be used as the metal nanowire and hydrazine ($N_2H_4$) may be used as the reducing agent. In such a manufacturing method, the metal nanowire is reduced as shown below in Equation 1. That is, a silver oxide becomes silver through reaction with a reducing agent, and neighboring nanowires are bonded (e.g., covalently bonded) to each other during the reduction process.

$$2Ag_2O + N_2H_4 \rightarrow 4Ag + N_2 + 2H_2O \qquad \text{Equation 1}$$

Due to the reduction, neighboring metal nanowires are connected to each other. Next, the reduced metal nanowire will be described with reference to FIG. 2 and FIG. 3.

Figure 2:
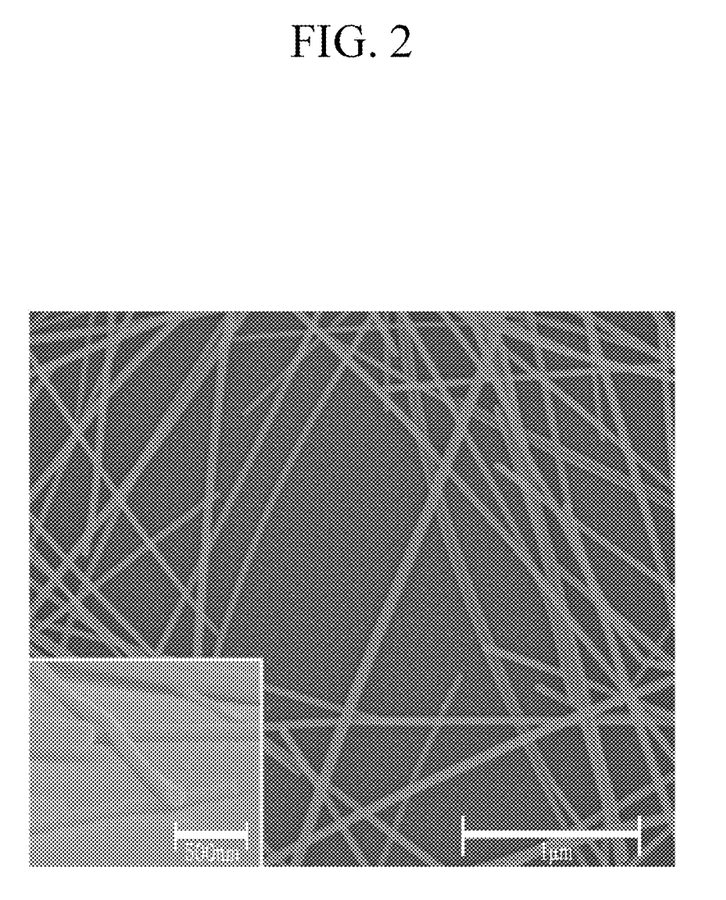
FIG. 2 is a scanning electron microscope (SEM) image of the metal nanowires before being reduced.
Figure 3:
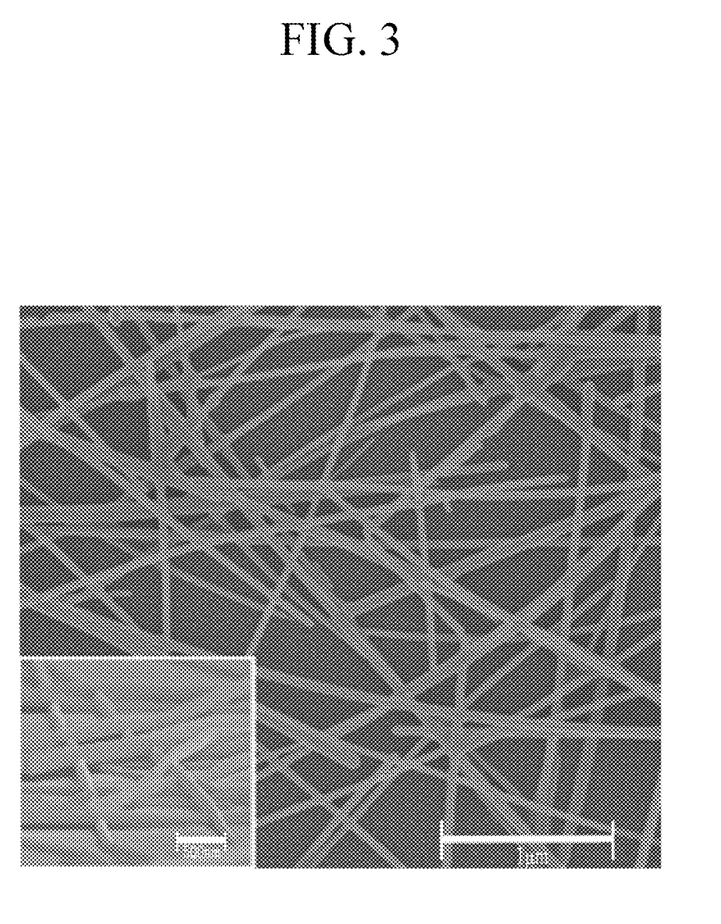
FIG. 3 is an SEM image of the metal nanowires after being reduced.

FIG. 2 is a scanning electron microscope (SEM) image of metal nanowires before being reduced, and FIG. 3 is an SEM image of the metal nanowires after being reduced according to the exemplary embodiment.

Referring to FIG. 2, the metal nanowires are not connected with each other and they are overlapped with each other before the chemical reduction. However, after the chemical reduction is carried out, according to the present exemplary embodiment, the metal nanowires are connected (bonded) with each other as shown in FIG. 3. Accordingly, the metal nanowires are connected with each other such that a metal nanowire layer is formed, and the metal nanowire layer may be used as a metal nanowire electrode or as a wire.

In general, a post-process may be carried out to coat a material to prevent oxidation and to provide a connection between the metal nanowires. However, transmittance of the metal nanowire may be reduced after the post-process or a substrate may be damaged due to heat or pressure applied to facilitate the connection of the metal nanowires.

However, according to the present exemplary embodiment, transmittance of the metal nanowire is not reduced even after the chemical reaction, and a metal nanowire layer having high electro-optic characteristics can be formed.

Further, since the metal nanowires are physically connected with each other through the reduction treatment, resistance is not changed even if additional oxidation occurs in the air.

During the chemical reduction treatment, an oxide film present in a junction between the metal nanowires may be removed and thus neighboring metal nanowires are fused together due to the chemical reduction treatment. Thus, resistance of the metal nanowires can be significantly reduced.

Next, resistance of the metal nanowire will be described with reference to FIGS. 4A and 4B.

Figure 4A:
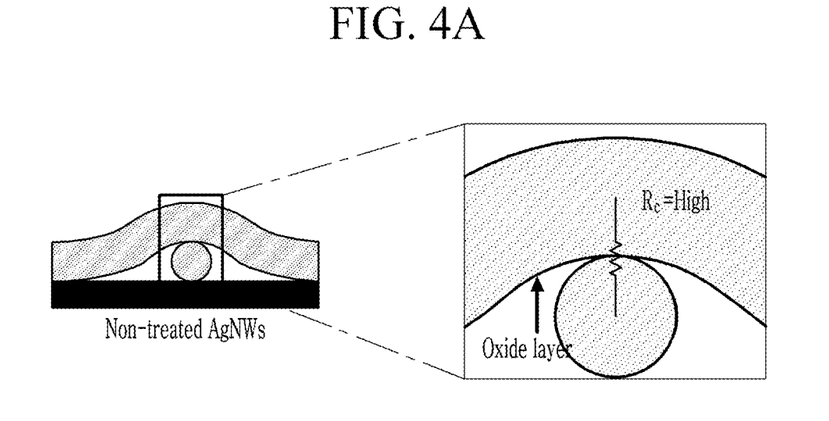
FIG. 4A is an illustration of a magnified view of the interface of the non-reduced silver nanowires.
Figure 4B:
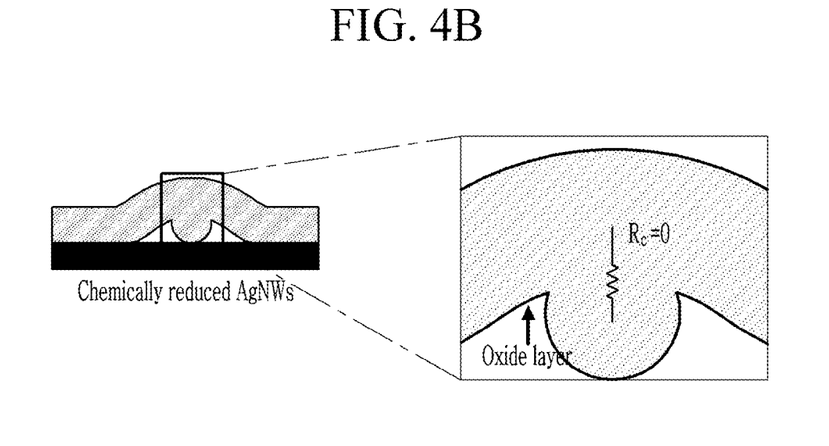
FIG. 4B is an illustration of a magnified view of the interface of the reduced silver nanowires.

FIG. 4A is an illustration of a magnified view of the interface of the non-reduced silver nanowires, FIG. 4B is an illustration of a magnified view of the interface of the reduced silver nanowires Referring to FIGS. 4A and 4B, the oxide film is removed at the interface of the reduced silver nanowires due to a reduction reaction, and accordingly, resistance at the interface is reduced.

In a general method of manufacturing a metal nanowire electrode, a material that can block oxygen or moisture may be additionally coated on the metal nanowire in order to prevent oxidation of the metal nanowire, however, such a method decreases transmittance of the metal nanowire electrode. The method for manufacturing the metal nanowire electrode according to the present exemplary embodiment, performs a chemical reduction such that oxidation can be prevented without causing deterioration in transmittance.

Next, electrical transmittance and sheet resistance of the metal nanowire according to the reducing agent treatment period will be described with reference to FIGS. 5A to 5D and FIG. 6.

FIG. 5 shows a change in transmittance and sheet resistance of a silver nanowire according to the reducing agent (hydrazine) treatment time. FIGS. 5B to 5D are SEM images of the metal nanowires after 10 minutes, 20 minutes, or 30 minutes of hydrazine treatment.

Figure 5A:
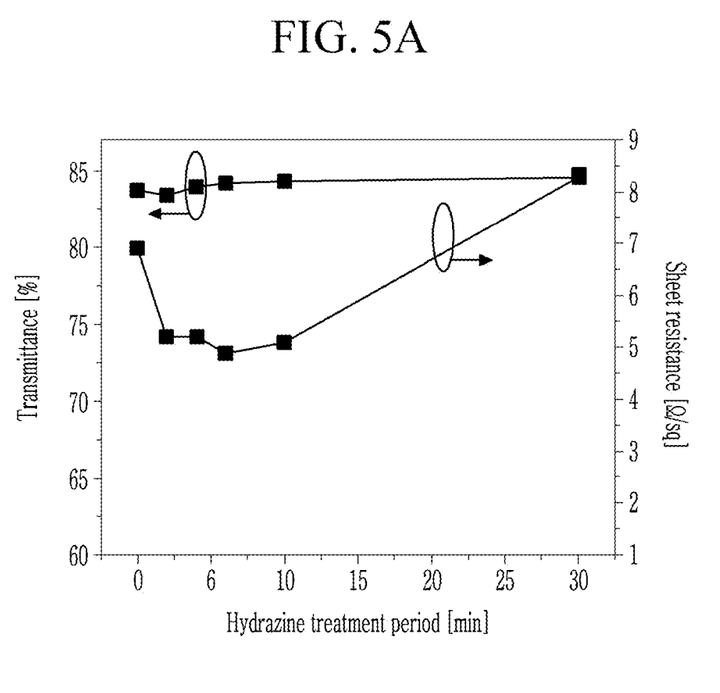
FIG. 5A is a graph of transmittance (percent, %) versus hydrazine treatment period (minutes, min.) versus sheet resistance (ohms per square, Ω/sq), which shows a change in transmittance and sheet resistance of silver nanowires according to the reducing agent treatment time.
Figure 5B:
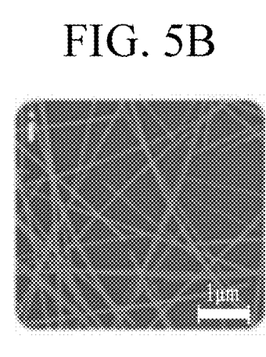
FIGS. 5B to 5D are SEM images of the metal nanowires after 10 minutes, 20 minutes, or 30 minutes of hydrazine treatment.
Figure 5C:
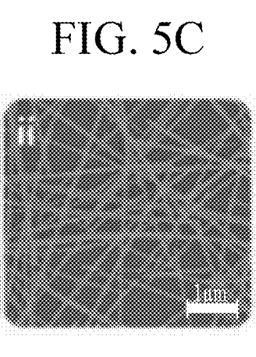
Figure 5D:
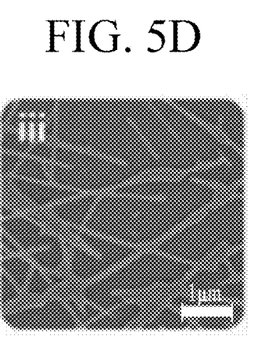

Referring to FIG. 5A, the transmittance is gradually increased as the reducing agent (hydrazine) treatment time is increased. The sheet resistance is decreased and then increased again, however, the sheet resistance remains lower than 10 ohms per square ($\Omega$/sq). Accordingly, when hydrazine is used as a reducing agent with respect to the silver nanowire, an appropriate treatment time is about 1 min to about 20 min, or from about 1 minute to about 18 minutes). Referring to FIGS. 5B to 5D, it can be seen that the connection between the metal nanowires increases when the treatment time is about 1 to about 20 minutes.

Figure 6:
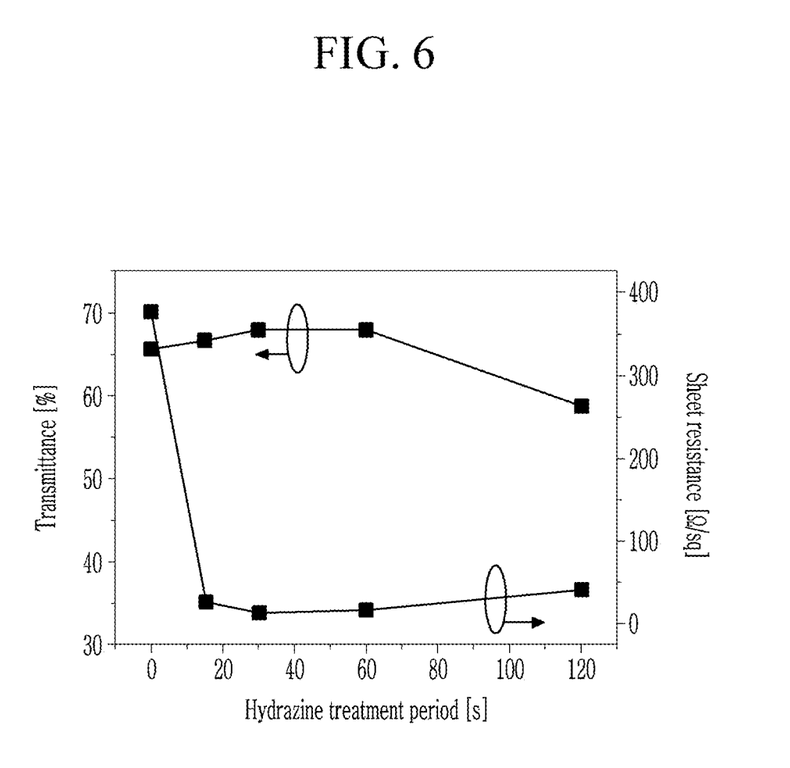
FIG. 6 is a graph of transmittance (%) versus hydrazine treatment period (seconds, s) versus sheet resistance (Ω/sq), which shows a change of transmittance and sheet resistance of copper nanowires according to the reducing agent treatment time.

FIG. 6 shows a change in transmittance and sheet resistance of a copper nanowire according to the reducing agent (e.g., hydrazine) treatment time.

Referring to FIG. 6, the transmittance increases and then decreases as reducing agent (hydrazine) treatment time is increased, and sheet resistance gradually increases after being suddenly decreased. Thus, when hydrazine is used as a reducing agent with respect to the copper nanowire, an appropriate treatment time is about 20 seconds to about 60 seconds.

The method of manufacturing the metal nanowire electrode according to the present exemplary embodiment, forms a metal nanowire electrode by chemically reducing the metal nanowires (S20), and then separates the metal nanowire layer from the preliminary substrate (S25).

After forming the metal nanowire electrode by chemically reducing the metal nanowires and connecting neighboring metal nanowires, the preliminary substrate to which the metal nanowire layer is attached, is immersed in water so that the metal nanowire layer and the preliminary substrate can be separated. When the preliminary substrate to which the metal nanowire layer is attached is immersed in water, the metal nanowire layer is released from the substrate and floats on a surface of the water such that the preliminary substrate can be separated from the metal nanowire layer. This process will be described with reference to FIG. 7.

Figure 7:
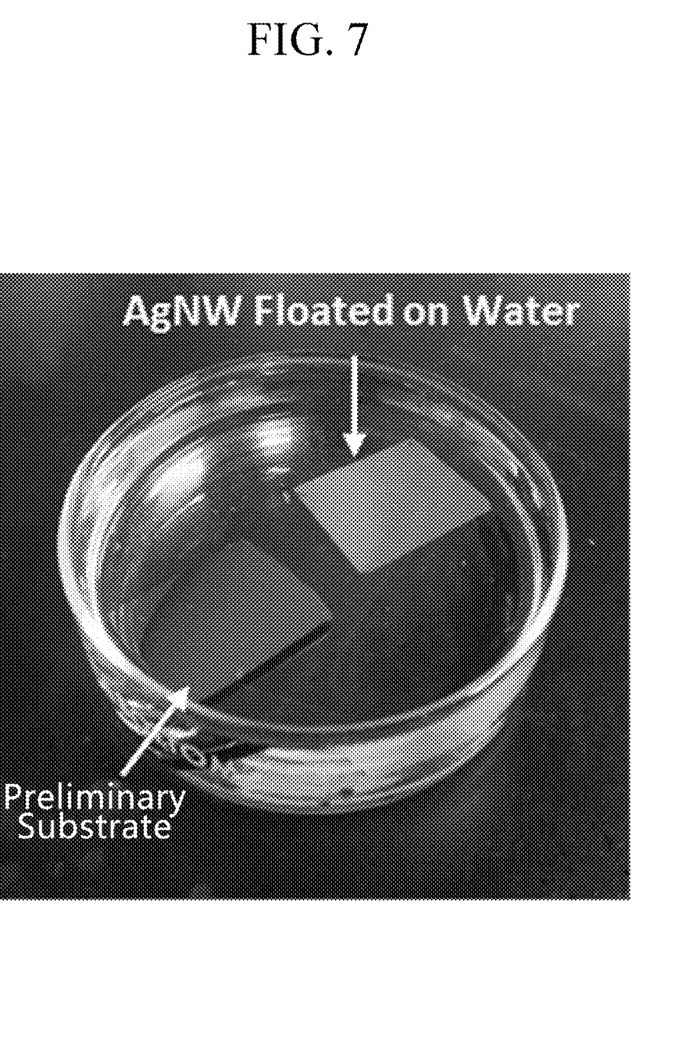
FIG. 7 is an image showing a step for separating the metal nanowire layer attached to the preliminary substrate by immersing the preliminary substrate in water.

FIG. 7 is an image showing a step for separating the metal nanowire layer attached to the preliminary substrate by immersing the preliminary substrate and the metal nanowire layer in water.

Referring to FIG. 7, when a metal nanowire layer (AgNW) attached to the preliminary substrate is immersed in water, the metal nanowire layer (AgNW) and the preliminary substrate are separated from each other and the metal nanowire layer (AgNW) is floats on the surface of the water.

Next, the separated metal nanowire layer is transferred to a carrier substrate (S30). After the preliminary substrate and the metal nanowire layer are separated from each other by immersing the preliminary substrate in water, the carrier substrate is immersed in the water and the metal nanowire layer is transferred to the carrier substrate.

The carrier substrate immersed in water is lifted such that the metal nanowire layer floating on water can be transferred to the surface of the carrier substrate. The surface of the carrier substrate may include a hydrophobic treatment. Here, the carrier substrate may include polytetrafluoroethylene (PTFE), polydimethylsiloxane (PDMS), polyimide (PI), an acryl polymer, polyethylene terephthalate (PET), poly(methyl methacrylate) (PMMA), poly(urethane acrylate), or a combination thereof.

An adhesive pattern is formed on the target substrate (S35), and then the metal nanowire layer is transferred from the carrier substrate to the target substrate such that the metal nanowire electrode is formed (S40). Next, the forming of an adhesive pattern and the forming of a metal nanowire electrode will be described with reference to FIG. 8 to FIG. 10.

Figure 8:
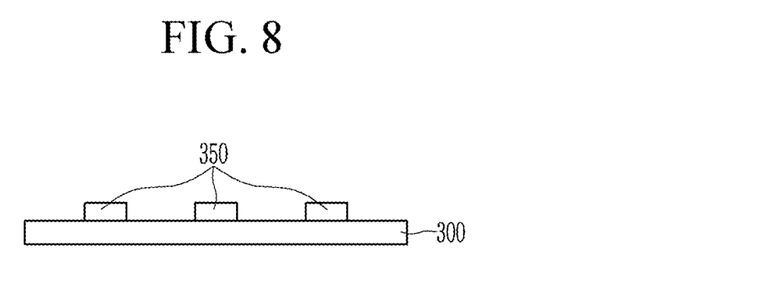
FIG. 8 to FIG. 10 schematically show a method of manufacturing a metal nanowire electrode according to an exemplary embodiment.
Figure 9:
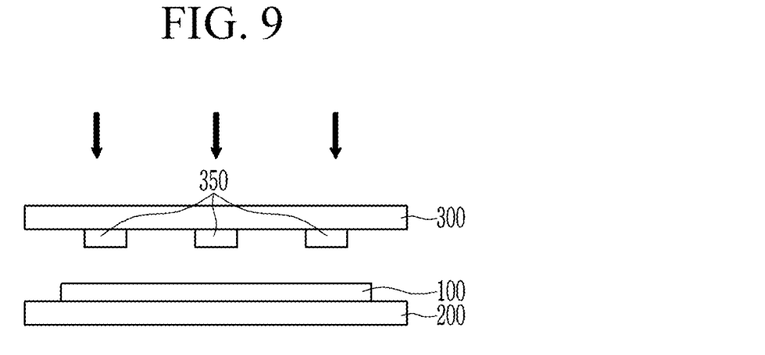
Figure 10:
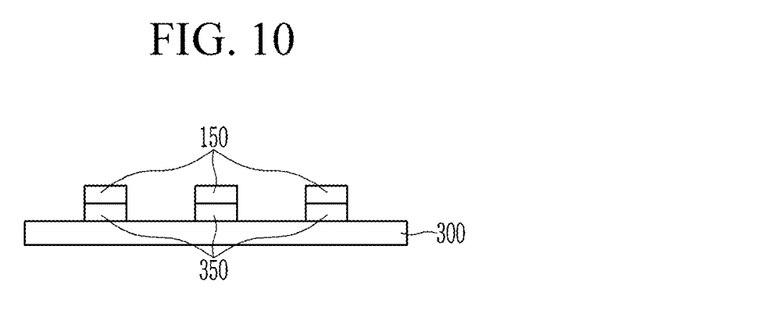

FIG. 8 to FIG. 10 schematically show an example of a method of manufacturing a metal nanowire electrode according to an exemplary embodiment.

Referring to FIG. 8, an adhesive pattern 350 is formed on a target substrate 300. The adhesive pattern 350 may include polydimethylsiloxane (PDMS), polyimide (PI), an acryl polymer, polyethylene terephthalate (PET), poly(methyl methacrylate) (PMMA), poly(urethane acrylate), polystyrene (PS), polydopamine, or a combination thereof.

The adhesive pattern 350 may be formed by printing the adhesive pattern 350 onto a surface of the target substrate 300 using a laser printer and the like. The type of pattern formed is not limited and various different patterns may be formed.

The target substrate 300 may be a flexible substrate including plastic, paper, or an organic material.

Referring to FIG. 9 and FIG. 10, a metal nanowire layer 100 is transferred from the carrier substrate 200 to the target substrate 300 where the adhesive pattern 350 is formed, such that a metal nanowire electrode 150 is formed on the adhesive pattern 350.

In detail, the metal nanowire layer 100 on the surface of the carrier substrate 200 is contacted with the adhesive pattern 350 on the target substrate 300. The carrier substrate 200 to which the metal nanowire layer 100 is attached, and the target substrate 300 where the adhesive pattern 350 is formed (refer to FIG. 9) are compressed. In this case, a roller may be used to compress the carrier substrate 200 and the target substrate 300.

Next, when the carrier substrate 200 is separated from the target substrate 300 after the compression, the metal nanowire layer 100 attached to the carrier substrate 200 is partially adhered to the adhesive pattern 350 such that the metal nanowire electrode 150 is formed (refer to FIG. 10). When the metal nanowire layer 100 is adhered to the adhesive pattern 350 and the carrier substrate 200 is separated from the target substrate 300, the metal nanowire layer 100 adhered to the adhesive pattern 350 is separated from the carrier substrate 200 such that the metal nanowire electrode 150 is formed.

As described, after the adhesive pattern 350 is formed, the metal nanowire layer 100 is transferred such that the metal nanowire electrode 150 is formed, and accordingly, adherence between the metal nanowire electrode 150 and the target substrate 300 can be improved without performing a post-treatment process. In addition, since the metal nanowires are connected to each other by the chemical reduction, no post-treatment process is performed after transferring, and accordingly, the target substrate 300 can be prevented from being damaged due to a post-treatment process.

The carrier substrate 200 can be reused by removing any residual metal nanowire layer 100 remaining on the carrier substrate 200. In addition, the removed metal nanowire layer 100 can also be reused.

Further, the metal nanowire electrode formed by the method for manufacturing the metal nanowire electrode according to the present exemplary embodiment can be reused if sheet resistance increases over time, by performing the chemical reduction treatment again on the metal nanowire electrode.

Next, a metal nanowire electrode according to an exemplary embodiment will be described with reference to FIG. 11 and FIG. 12.

Figure 11:
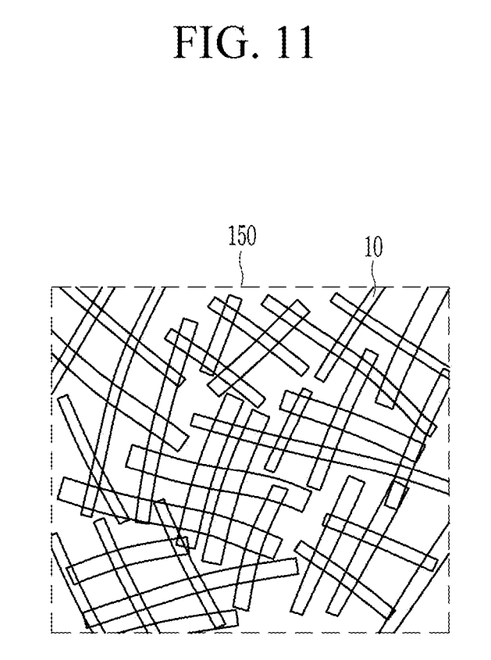
FIG. 11 is an illustration schematically showing a metal nanowire electrode according to an exemplary embodiment.

FIG. 11 schematically shows a metal nanowire electrode according to an exemplary embodiment.

Referring to FIG. 11, a metal nanowire electrode 150 formed through the above-described method for manufacturing the metal nanowire electrode, includes a plurality of metal nanowires 10. Each metal nanowire 10 is connected to a neighboring metal nanowire 10. That is, the metal nanowire electrode 150 may have a shape in the form of a network or a mesh where the plurality of metal nanowires 10 are connected to each other.

The metal nanowire electrode 150 formed by the above-described method for manufacturing the metal nanowire electrode has improved adherence to the target substrate by adhering to the target substrate 300 through the adhesive pattern 350, and accordingly, mechanical stability of the metal nanowire electrode 150 can be improved.

Further, since the metal nanowire electrode 150 has a shape in the form of a network or a mesh where the plurality of metal nanowires 10 are connected with each other, stability of the metal nanowire electrode 150 with respect to bending, folding, or stretching can be improved. Accordingly, the metal nanowire electrode 150 can be applied to a bendable device, a foldable device, or a stretchable device.

Figure 12:
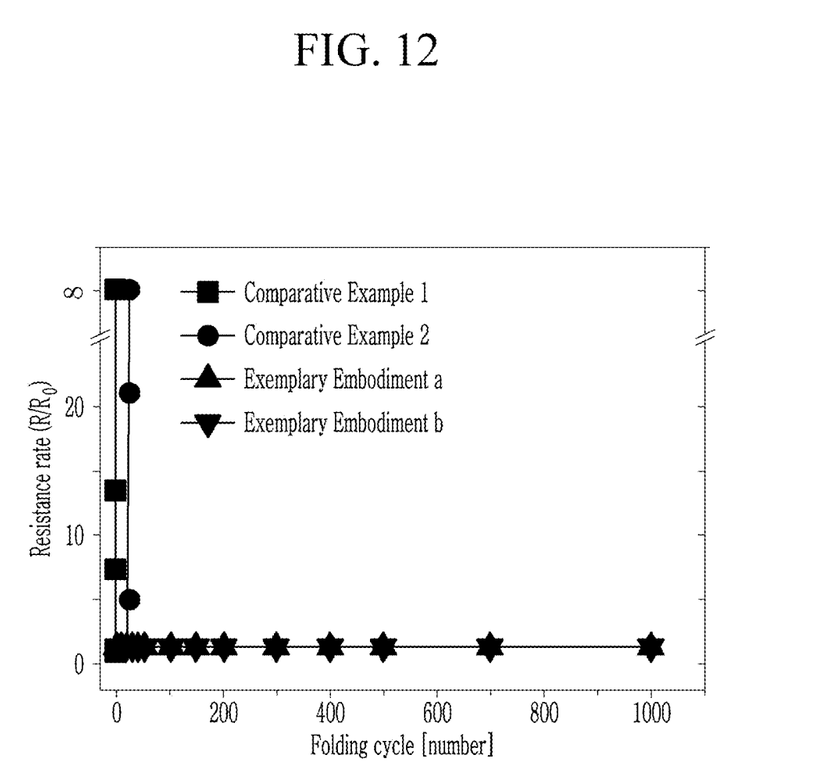
FIG. 12 is a graph of the resistance ratio $R/R_0$ versus the number of folding cycles, for determining mechanical stability of the metal nanowire electrode according to the exemplary embodiment.

FIG. 12 is a graph measuring the mechanical stability of the metal nanowire electrode according to an exemplary embodiment.

In FIG. 12, resistance of a silver electrode of Comparative Example 1, a silver nanowire electrode of Comparative Example 2, and the silver nanowire electrode of Exemplary Embodiments a and b is measured after being folded and then unfolded, respectively.

The silver electrode of Comparative Example 1 is formed by deposition, and the silver nanowire electrode of Comparative Example 2 is formed without an adhesive pattern. Exemplary Embodiment a is a case in which the silver nanowire electrode prepared using the exemplary method described herein, is folded inwardly and then unfolded, and Exemplary Embodiment b is a case in which the silver nanowire electrode prepared using the exemplary method described herein, is folded outwardly and then unfolded.

In FIG. 12, the resistance ratio $R/R_0$, in which $R_0$ denotes resistance before folding and R denotes the resistance after a cycle of folding and unfolding, as a function of the folding cycle number is shown.

Referring to FIG. 12, the $R/R_0$ values of the silver electrode according to Comparative Example 1 and the silver nanowire electrode according to Comparative Example 2 are infinite after repeated cycles of folding and unfolding. That is, the silver electrode according to Comparative Example 1 and the silver nanowire electrode according to Comparative Example 2 are broken after the repeated cycles of folding and unfolding.

On the other hand, the silver nanowire electrode of Exemplary Embodiments a and b have an almost constant $R/R_0$ value even after the electrode is folded inwardly and then unfolded (Exemplary Embodiment a). That is, the silver nanowire electrode according to the present exemplary embodiments can maintain mechanical stability without breaking even after being iteratively folded and unfolded.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a metal nanowire electrode, the method comprising:

forming a plurality of metal nanowires on a preliminary substrate;

forming a metal nanowire layer by chemically reducing the plurality of metal nanowires;

separating the metal nanowire layer from the preliminary substrate;

transferring the separated metal nanowire layer to a surface of a carrier substrate, wherein the surface of the carrier substrate comprises a hydrophobic treatment;

forming an adhesive pattern on a target substrate; and forming the metal nanowire electrode by transferring the separated metal nanowire layer to the target substrate.

2. The method of manufacturing the metal nanowire electrode of claim 1, wherein, in the forming of the metal nanowire layer, the plurality of metal nanowires are reduced and thus neighboring metal nanowires are connected to each other.

3. The method of manufacturing the metal nanowire electrode of claim 2, wherein a reducing agent used in the forming of the metal nanowire layer comprises, a tetrahydroborate, a polyhydroxybenzene, hydrazine, hydroxylamine, formaldehyde, hypophosphites, sulfites, lithium tetrahydroborate, sodium tetrahydroborate, potassium tetrahydroborate, LiAlH$_4$, hydroquinone, alkyl-substituted hydroquinone, pyrogallol, phenylenediamines, aminophenols, ascorbic acid, ascorbic acid ketals, an ascorbic acid-containing material, 3-pyrazolidinone, hydroxytetronic acid, hydroxytetronamide, bisnaphthols, sulfonamidophenols, lithium, sodium, potassium, or a combination thereof.

4. The method of manufacturing the metal nanowire electrode of claim 3, wherein the metal nanowire comprises lead, indium, tin, aluminum, silver, copper, gold, platinum, titanium, iron, nickel, cobalt, or a combination thereof.

5. The method of manufacturing the metal nanowire electrode of claim 4, wherein the metal nanowire comprises silver, the reducing agent used in forming of the metal nanowire layer is hydrazine, and a reduction time is about 1 minute to about 10 minutes.

6. The method of manufacturing the metal nanowire electrode of claim 4, wherein the metal nanowire comprises copper, the reducing agent used in the forming of the metal nanowire layer is hydrazine, and a reduction time is about 20 seconds to about 60 seconds.

7. The method of manufacturing the metal nanowire electrode of claim 1, wherein the separating of the metal nanowire layer from the preliminary substrate is performed by immersing the metal nanowire layer in water.

8. The method of manufacturing the metal nanowire electrode of claim 7, wherein, in the transferring the separated metal nanowire layer to a surface of the carrier substrate, the carrier substrate is immersed in water.

9. The method of manufacturing the metal nanowire electrode of claim 8, wherein the carrier substrate comprises polytetrafluoroethylene, polydimethylsiloxane, polyimide, an acryl polymer, polyethylene terephthalate, poly(methyl methacrylate), poly(urethane acrylate), or a combination thereof.

10. The method of manufacturing the metal nanowire electrode of claim 9, wherein the forming of the metal nanowire electrode further comprises:

contacting the metal nanowire layer on the surface of the carrier substrate with the adhesive pattern on the target substrate;

optionally compressing the carrier substrate to transfer the separated metal nanowire layer to the target substrate; and separating the carrier substrate from the target substrate.

11. The method of manufacturing the metal nanowire electrode of claim 10, wherein the metal nanowire electrode is formed on the adhesive pattern.

12. The method of manufacturing the metal nanowire electrode of claim 11, wherein the adhesive pattern comprises polydimethylsiloxane, polyimide, an acryl polymer, polyethylene terephthalate, poly(methyl methacrylate), poly(urethane acrylate), polystyrene, polydopamine, or a combination thereof.

* * * * *